(12) United States Patent
Wada et al.

(10) Patent No.: US 9,755,108 B2
(45) Date of Patent: Sep. 5, 2017

(54) LIGHT EMITTING DEVICE AND METHOD FOR MANUFACTURING LIGHT EMITTING DEVICE

(71) Applicant: TOYODA GOSEI CO., LTD., Kiyosu-shi (JP)

(72) Inventors: Satoshi Wada, Kiyosu (JP); Yoshiki Taniyama, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/073,291

(22) Filed: Mar. 17, 2016

(65) Prior Publication Data

US 2016/0276557 A1    Sep. 22, 2016

(30) Foreign Application Priority Data

Mar. 20, 2015  (JP) .................... 2015-058217

(51) Int. Cl.
  *H01L 33/22*   (2010.01)
  *H01L 33/48*   (2010.01)
  *H01L 33/54*   (2010.01)

(52) U.S. Cl.
  CPC ............ *H01L 33/22* (2013.01); *H01L 33/486* (2013.01); *H01L 33/54* (2013.01); *H01L 2224/16225* (2013.01); *H01L 2224/73253* (2013.01); *H01L 2924/181* (2013.01); *H01L 2933/0091* (2013.01)

(58) Field of Classification Search
  CPC ......... H01L 33/20; H01L 33/22; H01L 33/52; H01L 33/54
  See application file for complete search history.

(56) References Cited

U.S. PATENT DOCUMENTS

| 8,455,907 | B2 | 6/2013 | Waragawa et al. |
| 8,461,610 | B2 | 6/2013 | Ito et al. |
| 2005/0056831 | A1* | 3/2005 | Senda ............... H01L 33/22 257/40 |

FOREIGN PATENT DOCUMENTS

| JP | 5326705 B2 | 10/2013 |
| JP | 5539849 B2 | 7/2014 |

* cited by examiner

*Primary Examiner* — Cuong Q Nguyen
(74) *Attorney, Agent, or Firm* — McGinn IP Law Group, PLLC.

(57) ABSTRACT

A light emitting device includes: a semiconductor light emitting element having a sapphire substrate and a semiconductor layer; a mounting board; and a light transmission member, wherein: the sapphire substrate is bonded to the light transmission member by an adhesive material; the semiconductor light emitting element is mounted on the mounting board in the form of a flip-chip; and a roughened peripheral edge part is formed in the sapphire substrate in the mounting board side.

11 Claims, 5 Drawing Sheets

LIGHT EMITTING DEVICE AND METHOD FOR MANUFACTURING LIGHT EMITTING DEVICE

CROSS-REFERENCE TO RELATED APPLICATION(S)

This application is based upon and claims the benefit of priority from Japanese Patent Application No. 2015-058217, filed on Mar. 20, 2015, the entire contents of which are incorporated herein by reference.

BACKGROUND

1. Field of the Invention

The present invention relates to a light emitting device and a method for manufacturing the light emitting device.

2. Description of the Related Art

Usually, a light emitting device is provided which has a structure that a light emitting element mounted on a mounting board in the form of a flit chip is bonded to a light transmission member having an area larger than that of an upper surface of the light emitting element by an adhesive material to form an adhesive material layer having an inclined surface which connects a side surface of the light emitting element to an end part of the light transmission member by the adhesive material protruding from a part between the light emitting element and the light transmission member. In such a structure, lights outputted from the side surface of the light emitting element are reflected upward by the inclined surface of the adhesive material layer, so that an efficiency of taking out the lights upward from the light emitting device can be improved. As an example of such a light emitting device, the device disclosed in Japanese Patent No. 5539849 can be exemplified.

In the above-described structure, when a position of an end part of the adhesive material layer in the mounting board side is separated upward too much from the mounting board, a problem arises that the side surface of the light emitting element cannot be sufficiently covered with the adhesive material layer, and accordingly, the taking-out efficiency of the lights from the side surface of the light emitting element is deteriorated. On the contrary, when the position of the end part of the adhesive material layer of the mounting board side is too close to the mounting board side so that the adhesive material reaches the mounting board, a problem also arises that the lights passing through the adhesive material layer leak to the mounting board side to deteriorate the taking out efficiency of the lights.

SUMMARY

The present invention is devised by considering the above-described problems, and it is an object of the present invention to suppress a deterioration of a light taking out efficiency of a light emitting device having a structure that a light emitting element is bonded to a light transmission member by an adhesive material.

In order to solve the above-described problems, the inventor et al. eagerly studied, so that they hit upon respective aspects of the present invention as described below.

Specifically, according to one aspect of the present invention, there is provided a light emitting device including: a semiconductor light emitting element having a sapphire substrate and a semiconductor layer; a mounting board; and a light transmission member, wherein: the sapphire substrate is bonded to the light transmission member by an adhesive material; the semiconductor light emitting element is mounted on the mounting board in the form of a flip-chip; and a roughened peripheral edge part is formed in the sapphire substrate in the mounting board side.

According to the structure of the above-described aspect, a flow of an adhesive material to be solidified which protrudes from a part between a sapphire substrate and a light transmission member and flows (runs down) along a side surface of the sapphire substrate can be interrupted by a roughened surface (namely, an irregular surface) of a roughened peripheral edge part. Thus, an end part of an inclined surface of an adhesive material layer which is formed in the periphery of the side surface of the sapphire substrate in a mounting board side due to a solidification of the adhesive material can be located on the roughened peripheral edge part. Since the roughened peripheral edge part is formed in the sapphire substrate of the mounting board side, the end part of the inclined surface of the adhesive material layer in the mounting board side can be allowed to come close to the mounting board as much as possible within a range that the adhesive material layer does not come into contact with the mounting board. Accordingly, an occurrence of a problem can be suppressed that a position of the end part of the adhesive layer in the mounting board side is too much separated upward from the mounting board or the adhesive material layer reaches the mounting board. Thus, lights from the side surface of a light emitting element can be efficiently reflected upward and taken out. Thus, a light taking out efficiency can be restrained from being deteriorated as an entire part of a light emitting device.

According to another aspect of the present invention, the roughened peripheral edge part is formed by roughening the side surface of the sapphire substrate. In that case, the sapphire substrate may include the roughened peripheral edge part, a wall opening surface and a laser beam machined surface in order from the mounting board side.

According to a still another aspect of the present invention, when an entire part of a surface of the sapphire substrate opposed to the mounting board is roughened to remove a peripheral edge part of a semiconductor layer, the roughened peripheral edge part is formed.

According to a still another aspect of the present invention, the roughened peripheral edge part is coated with a material having wettability lower than that of the sapphire substrate. Thus, an interruption effect of the adhesive material by the roughened peripheral edge part can be more improved. As a material having lower wettability than that of the sapphire substrate, $SiO_2$ may be used.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1A:
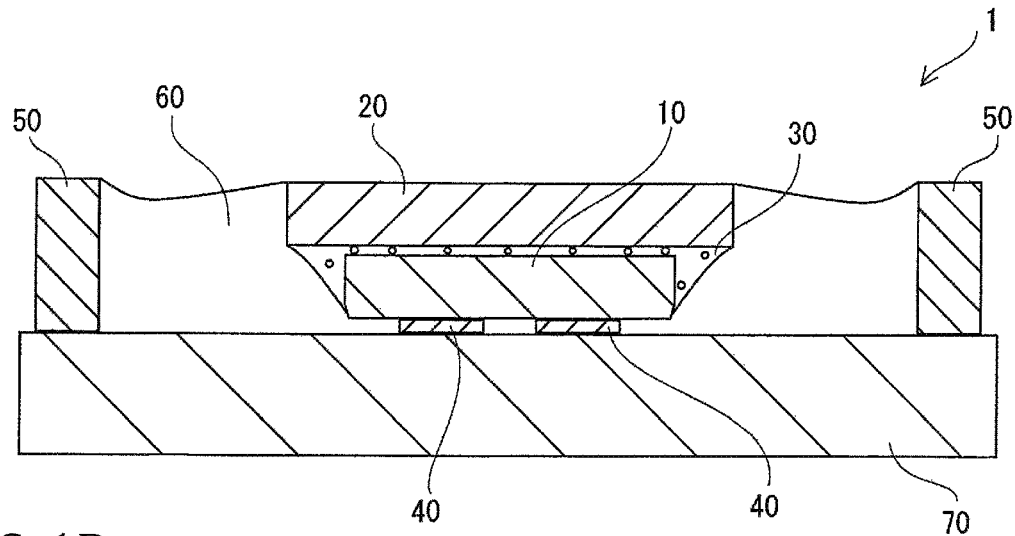
FIG. 1A is a sectional view which schematically shows a light emitting device according to a first exemplary embodiment of the present invention.

Now, exemplary embodiments respectively embodying the present invention will be described below by referring to the drawings. Corresponding component elements between the exemplary embodiments are designated by using the same reference numerals and a duplicated explanation of the same structures is omitted. In the drawings, dimensions, configurations and arranged positions of component members respectively in the exemplary embodiments are schematically shown in order to easily understand the explanation. Thus, the dimensions, the configurations and the arranged positions of the components members do not necessarily correspond to actual dimensions, configurations and arranged positions. Further, in the explanation described below, the top and bottom and the right and left mainly imply directions in the drawings and are not related to directions in an actual using state of the device and the elements of the present invention.

First Exemplary Embodiment

FIG. 1A is a schematic sectional view of a light emitting device 1 according to a first exemplary embodiment of the present invention. As shown in the drawing, the light emitting device 1 includes a light emitting element 10, a light transmission member 20, an adhesive material layer 30, bumps 40, a dam 50, a reflective material layer 60 and a mounting board 70. The light emitting element 10 is connected to the mounting board 70 having a wiring formed on an upper surface through a plurality of bumps 40. On the light emitting element 10, the light transmission member 20 with such a size as to cover an entire part of the light emitting element 10 is bonded and mounted by an adhesive material layer 30 made of a transparent adhesive material. In an outer side of the light emitting element 10, a dam 50 is formed. A space between the light emitting element 10 and the dam 50 is filled with the reflective material layer 60. The reflective material layer 60 covers outer peripheral side surfaces of the light emitting element 10, the light transmission member 20 and the adhesive material layer 30.

(Light Emitting Element 10)

The light emitting element 10 is preferably a flip-chip type and the light emitting element may be used which has a semiconductor layer 11 (an epitaxial layer) of a gallium nitride (GaN) type formed on a sapphire substrate 12. However, the exemplary embodiment of the present invention is not limited thereto. As the semiconductor layer 11 of the light emitting element 10, in addition thereto, a zinc oxide (ZnO) type, a zinc selenide (ZnSe) type, a silicon carbide type (SiC) or the like may be used. As the substrate, the substrate which is suitable respectively for the above-described materials may be used. As a luminous color of the light emitting element 10, blue, violet or ultraviolet lights are preferred which can excite a fluorescent material to take out a white color by compounding with fluorescence, however, the present invention is not limited thereto. The number of the light emitting elements 10 which are mounted on the mounting board is not limited to one and a plurality of light emitting elements 10 may be used. When the plurality of light emitting elements 10 are mounted on the mounting board, the light emitting elements are preferably arranged at prescribed intervals of chips.

(Light Transmission Member 20)

The light transmission member 20 is described as a fluorescent material plate including a fluorescent material and having a light transmission property in the present exemplary embodiment. In the application of the present invention, the present invention is not limited thereto. For instance, as the light transmission member 20, a lens or a light guide member or the like may be used, and the fluorescent material may be included or not be included. Any member having the light transmission property to which the present invention may be applied can be used as the light transmission member 20. An upper surface of the light transmission member 20 functions as a light taking out surface.

The light transmission member 20 as the fluorescent material plate according to the present exemplary embodiment may be designated as a member obtained in such a way that the fluorescent materials are dispersed in or applied to a mono-crystal of the fluorescent material, a poly-crystal of the fluorescent material, a sintered material of the fluorescent material, a resin or glass. Since the light transmission member 20 is bonded to the light emitting member 10, the light transmission member 20 which has stiffness and is not deformed by an adhesion is preferably used and an inorganic member such as the sintered material or the glass is preferred. The fluorescent material is excited by a light emission of the light emitting element 10 to generate a fluorescence of a prescribed color. The fluorescent color may be set to, for instance, such a fluorescent color as to take out a white color by compounding with the luminous color of the light emitting element 10. For instance, when a blue light emitting element is used as the light emitting element 10, a yellow fluorescent material may be independently used or a red fluorescent material may be combined with a green fluorescent material to use the combined fluorescent material.

(Adhesive Material Layer 30)

As the adhesive material which forms the adhesive material layer 30, a transparent resin such as a silicone resin, an epoxy resin, an acrylic resin or the like may be used. A viscosity (Pa·s) of the adhesive material is preferably set to 0.05 to 50. The adhesive material layer 30 may include beads 31 having prescribed particle diameters. The beads 31 are sandwiched between an upper surface of the light emitting element 10 and a lower surface of the light transmission member 20 to serve as a spacer and used to determine a film thickness of the adhesive material layer 30.

(Bump 40)

The bump 40 may be designated as a stud bump, a liner bump, a solder bump or the like. As a material of the bump 40, gold (Au), copper (Cu), silver-tin alloy (Ag/Sn) or the like may be exemplified. As a unit by which the light emitting element 10 is connected to a wiring pattern of the mounting board 70, methods by solder, electrically conductive paste, metallic particulates, a surface activation, an adhesive material or the like may be used in place of the bumps 40. As the solder, gold/tin (Au/Sn) solder is especially preferably used, because heat generated in the light emitting element 10 can be more efficiently radiated to the mounting board 70.

(Dam 50)

As a material of the dam 50, a resin or the like may be used. As the resin, the silicone resin, the epoxy resin, the acrylic resin may be used. As the resin, the same kind of resin as a resin of a material of the reflective material layer 60 is preferably used from the viewpoints that a reflective material of the reflective material layer 60 is liable to climb up the dam 50 and an adhesion property is good. In the resin of the dam 50, a light reflective material may be also included. A frame form of the dam 50 can be set to arbitrary configurations such as a rectangular frame configuration, an oval frame configuration, an elliptic frame configuration, a circular frame configuration or the like. As a sectional form of the dam 50, an arbitrary configuration may be adopted, for instance, a semi-circular configuration, a V-shaped configuration, a rectangular configuration or the like.

(Reflective Material Layer 60)

A reflective material which forms the reflective material layer 60 may be designated as a material obtained in such a way that a light reflective material is included in the resin. As the resin, the silicone resin, the epoxy resin, the acrylic resin or the like may be used. As the light reflective material, oxides of Ti, Zr, Nb, Al, Si, etc., AlN, MgF or the like may be used. Especially, in points of view of a heat resistance to the heat generated in the light emitting element 10 and a reflection of lights, a combination of the silicone resin and $TiO_2$ is preferred.

(Mounting Board 70)

As a material of the mounting board 70, arbitrary materials such as ceramic (aluminum nitride (AlN), alumina, etc.), a resin, metal with a surface insulated and coated or the like may be used. A form of the mounting board 70 may be arbitrary, for in stance, a rectangular form, a circular form, a triangular form or the like. As a material of the wiring pattern, gold, silver, aluminum or the like may be used.

Figure 1B:
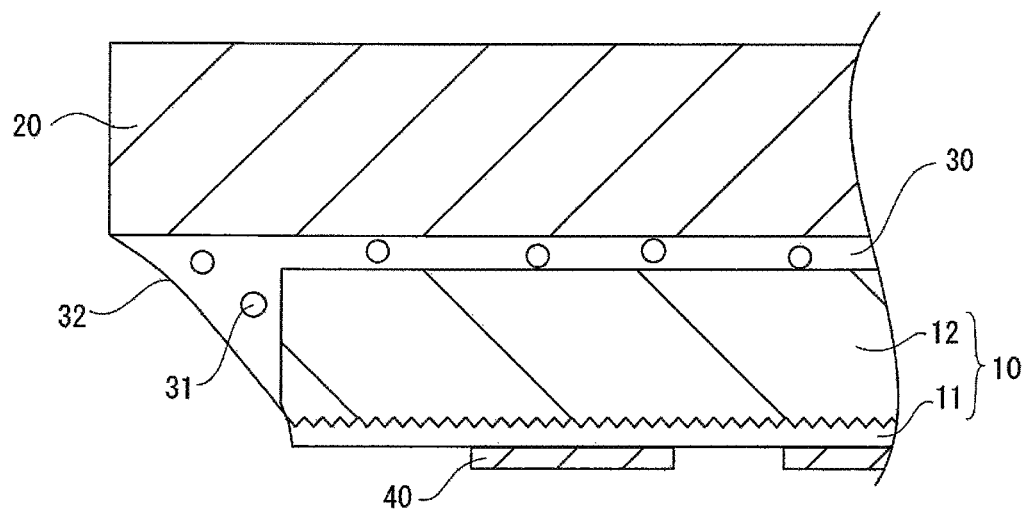
FIG. 1B and FIG. 1C are sectional views which schematically show only main parts of the light emitting device.

FIG. 1B is a diagram which observes only the light emitting element 10, the light transmission member 20, the adhesive material layer 30 and the bumps 40 as main parts of the light emitting device 1 shown in FIG. 1A and partly enlarges sections thereof. As shown in the drawing, on a lower surface of the sapphire substrate 12, irregularities are formed by methods of a dry etching, a wet etching or the like. On a surface having the irregularities formed (namely, a roughened surface), the semiconductor layer 11 is formed by an epitaxial growth. Further, a part of the adhesive material layer 30 located in a position opposed to a side surface of the light emitting element 10 has an inclined surface 32 inclined to the side surface of the light emitting element 10. The inclined surface 32 functions as a reflection surface.

As mentioned in a below-described manufacturing process of the light emitting device 1, the upper surface of the light emitting element 10 (the surface opposite to the semiconductor layer 11) is stuck to the lower surface of the light transmission member 20 by the adhesive material forming the adhesive material layer 30. At that time, the adhesive material to be solidified which protrudes from a part between the sapphire substrate 12 and the light transmission member 20 flows (runs down) along the side surface of the sapphire substrate 12. Thus, a meniscus is formed so as to connect the side surface of the light emitting element 10 to an end part of the light transmission member 20 by a surface tension of the adhesive material to be solidified, so that the inclined surface 32 of the adhesive material layer 30 is formed thereby.

Further, a periphery of the adhesive material layer 30 is filled with the material of the reflective material layer 60 to be hardened, so that the reflective material layer 60 is formed which has a configuration following the configuration of the inclined surface 32. The reflective material layer 60 also fills up gaps between the bumps 40 in a lower part of the light emitting element 10.

In the light emitting device 1, lights outputted upward from the upper surface of the light emitting element 10 pass through the adhesive material layer 30 and the light transmission member 20. At that time, the lights are partly absorbed by the fluorescent material and the fluorescence is emitted from the fluorescent material. The outputted lights of the light emitting element 10 and the fluorescence pass through the light transmission member 20 and are outputted from the upper surface (a light emitting surface) of the light transmission member 20.

Lights outputted from the side surface of the light emitting element 10 are incident on the adhesive material layer 30, reflected upward by the inclined surface 32 in a boundary of the reflective material layer 60 and the adhesive material layer 30, pass through the light transmission member 20 and are outputted from the upper surface. As described above, since most of the lights outputted from the side surface of the light emitting element 10 are not returned to an inner part of the light emitting element 10, the lights are not absorbed by the light emitting element 10. Further, since a distance of the side surface of the light emitting element 10 to the reflective material layer 60 is short, an influence of an absorption by the adhesive material layer 30 is hardly applied to the outputted lights.

Lights outputted from a lower surface of the light emitting element 10 are reflected by the reflective material layer 60 on a bottom surface of the light emitting element 10, directed upward, pass through the adhesive material layer 30 and the light transmission member 20 and are outputted from the upper surface.

Figure 1C:
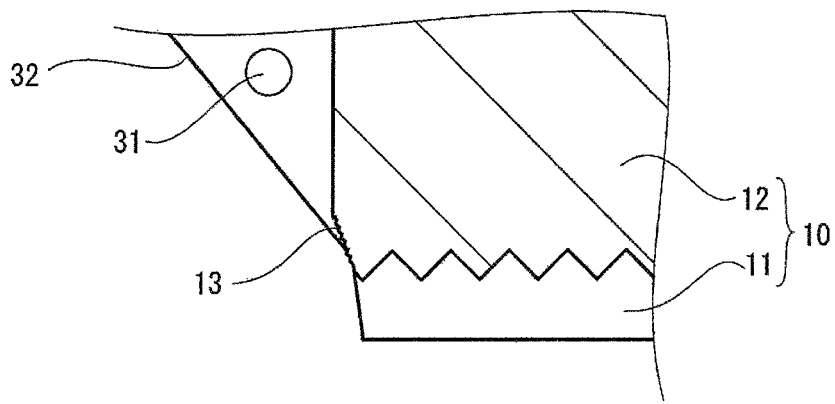

As described above, in the light emitting device 1 shown in FIGS. 1A to 1C, the lights outputted from the side surface of the light emitting element 10 can be reflected by the inclined surface 32 formed near the periphery of the side surface of the light emitting element 10 and outputted from the upper part. Thus, an efficiency of taking out the lights from the upper part of the light emitting element 10 can be improved. Especially, since most of the lights outputted from the side surface of the light emitting element 10 are not returned to the inner part of the light emitting element 10, pass through the short distance of the adhesive material layer 30, and then, are reflected by the reflective material layer 60 and directed upward, the taking out efficiency of the lights is improved.

FIG. 1C is a sectional view which more enlarges and schematically shows the main parts of the light emitting device 1 shown in FIG. 1B. As shown in a structure in the drawing, on the sapphire substrate 12 of the present exemplary embodiment in the mounting board 70 side, a roughened peripheral edge part 13 is formed. On the roughened peripheral edge part 13, a lower end part of the inclined surface 32 is located. The roughened peripheral edge part 13 is formed in such a way that a side surface of an entire peripheral edge of an angular part of the sapphire substrate 12 in the mounting board 70 side is roughened. According to such a structure, a flow of the adhesive material to be solidified which protrudes from the part between the sapphire substrate 12 and the light transmission member 20 and runs along the side surface of the sapphire substrate 12 can be dammed by a roughened surface (an irregular surface) of the roughened peripheral edge part 13.

Namely, the adhesive material to be solidified can be restrained from going over more to the mounting board 70 side than the roughened peripheral edge part 13. Thus, a position of the lower end part of the solidified adhesive material layer 30 in the mounting board 70 side can be allowed to come close to the mounting board 70 as much as possible within a range that the adhesive material forming the adhesive material layer 30 does not reach the mounting board 70. Thus, the lights from the side surface of the light emitting element 10 can be efficiently reflected upward and taken out. Thus, a deterioration of a light taking out efficiency can be suppressed as an entire part of the light emitting device 1.

Figure 2A:
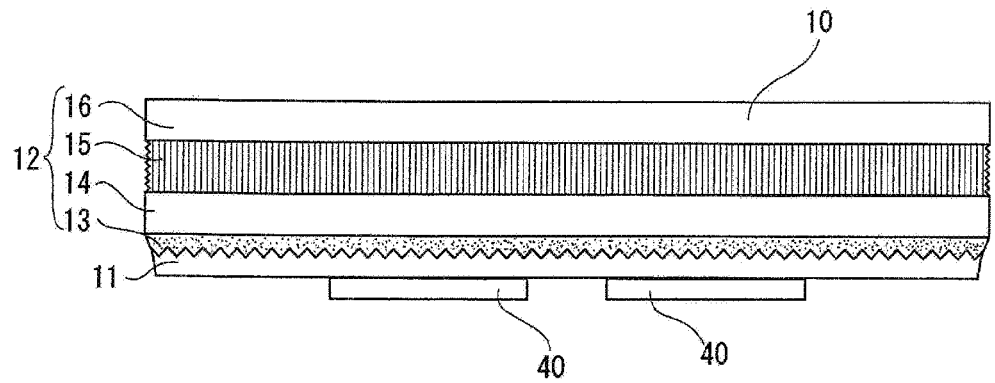
FIG. 2A is a front view which schematically shows main parts of the light emitting device according to the first exemplary embodiment.
Figure 2B:
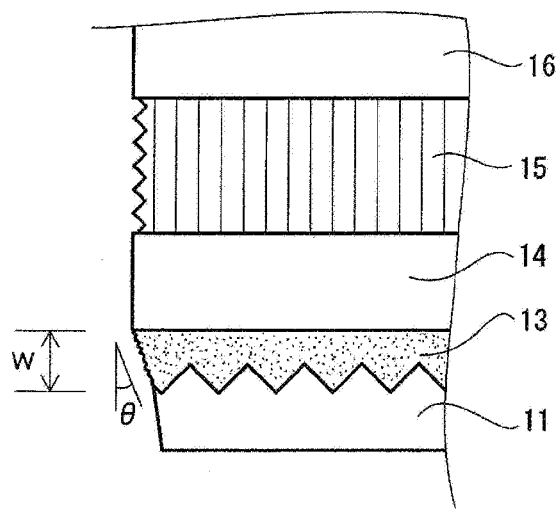
FIG. 2B is a partial front view which schematically shows only the main parts of the light emitting device shown in FIG. 2A.

Now, the roughened peripheral edge part 13 will be more specifically described below. FIG. 2A is a front view showing the light emitting element 10 and the bumps 40 shown in FIGS. 1A to 1C. The light emitting element 10 of the present exemplary embodiment is manufactured in such a way that a laser beam is applied along predetermined division lines to carry out a laser scribing process in which a reformed part is formed to divide the sapphire substrate 12. Accordingly, the side surface of the sapphire substrate 12 includes the roughened peripheral edge part 13, a first wall opening surface 14, a laser beam machined surface 15 (the reformed part) 15 and a second wall opening surface 16 in order from a side which is mounted on the mounting board 70. FIG. 2B is a diagram which enlarges and shows a left side lower angular part of the light emitting element 10 in FIG. 2A. However, in this case, the light emitting element 10 of the present invention may be manufactured without carrying out the laser scribing process.

Figure 2C:
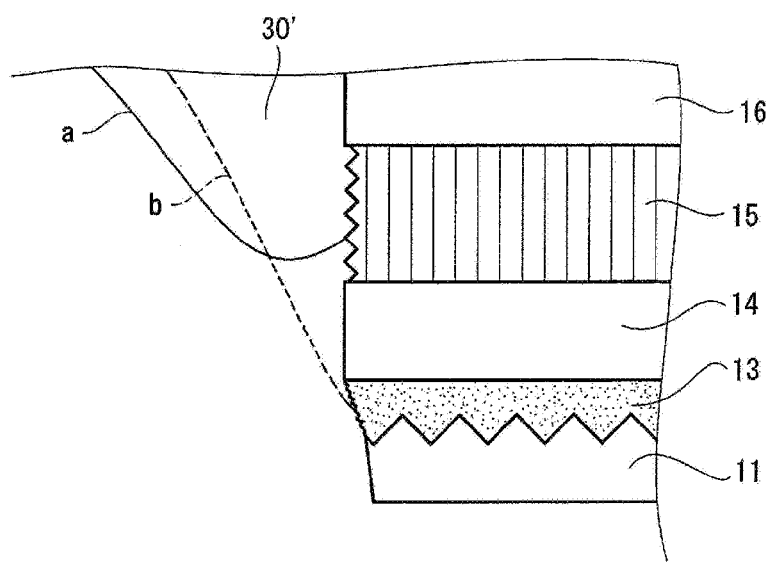
FIG. 2C is a diagram which schematically shows a part of a manufacturing process of the light emitting device shown in FIG. 2A.

When the light emitting element 10 is manufactured by the laser scribing process, the laser beam machined surface 15 has larger irregularities than those of the roughened peripheral edge part. In that case, when the light emitting element 10 is bonded to the light transmission member 20 by the adhesive material (refer the adhesive material to be solidified to as an "adhesive material 30'", hereinafter), a relatively large quantity of the adhesive material 30' which protrudes from the part between the sapphire substrate 12 and the light transmission member 20 relatively powerfully flows (runs down) along the second wall opening surface 16 of the sapphire substrate 12. At that time, a power of the flow of the adhesive material 30' which further runs across the second wall opening surface 16 can be weakened by the laser beam machined surface 15 having the larger irregularities. A full line a in FIG. 2C schematically shows one example of a configuration of the top of the flow of the adhesive material 30' at that time.

A part of the adhesive material 30' whose power is weakened by the irregularities of the laser beam machined surface 15 goes over the first wall opening surface 14, reaches the roughened peripheral edge part 13 and is stopped by the relatively small irregularities of the roughened peripheral edge part 13. A dotted line b in FIG. 2C schematically shows one example of a configuration of the top of the flow of the adhesive material 30' at that time. As described above, when the laser beam machined surface 15 is provided, since the quantity of the adhesive material 30' which reaches the roughened peripheral edge part 13 is relatively small and the power of the flow of the adhesive material 30' is weakened, an effect that the adhesive material 30' is dammed by the roughened peripheral edge part 13 is assuredly obtained. As a result, all the side surface of the sapphire substrate 12 can be assuredly covered with the adhesive material layer 30 and an effect of the reflection by the inclined surface 32 as a reflection surface can be assuredly obtained.

As described above, the roughened peripheral edge part 13 is obtained by roughening the side surface of the sapphire substrate 12 in the mounting board 70 side. Specifically, the side surface of the entire peripheral edge of the angular part of the sapphire substrate 12 in the mounting board 70 side is ground to be roughened by methods of a dry etching or an irradiation of a laser beam to form the roughened peripheral edge part 13. The roughened peripheral edge part 13 can be formed in such a way that under a state of a wafer before the light emitting element 10 is divided by opening a wall, a part of the sapphire substrate 12 is removed together with the semiconductor layer 11 by the dry etching or the irradiation of the laser beam along a predetermined division line of the wafer.

A width of the roughened peripheral edge part 13 (a width w in a vertical direction of FIG. 2B) is preferably located within a range of 1 to 40 µm. In order to assuredly dam the adhesive material 30', the width w of the roughened peripheral edge part 13 is more preferably located within a range of 5 to 25 µm. In this case, the width w of the roughened peripheral edge part 13 is set to an apparent width (shown by a symbol w in FIG. 2B) which is viewed in a direction intersecting at right angles to the side surface of the sapphire substrate 12. A surface roughness (Ra) of the roughened peripheral edge part 13 is preferably located within a range of 0.1 to 20 µm. An angle θ formed by the surface of the roughened peripheral edge part 13 to the side surface of the sapphire substrate 12 is preferably located within a range of 5 to 50°, because the climb of the adhesive material due to the surface tension can be stopped by the angle formed by the wall opening surface 14 and the roughened peripheral edge part 13. According to the above-described structure, a preferable dam effect of the adhesive material by the roughened peripheral edge part 13 can be obtained.

The roughened peripheral edge part 13 may be coated with a material having wettability lower than that of the sapphire substrate 12. Thus, an interruption effect of the adhesive material is improved in the roughened peripheral edge part 13. A film thickness of the material is preferably located within a range of 1000 to 2000 Å. In such a way, the irregularities of the roughened peripheral edge part 13 appear on the surface. $SiO_2$ or the like may be used as the material lower in its wettability than that of the sapphire substrate 12. The gallium nitride (GaN) type semiconductor layer 11 may be coated with a material lower in its wettability than that of the semiconductor layer 11 and that of the sapphire substrate 12 like the roughened peripheral edge part 13. Thus, the adhesive material 30' which gets over the roughened peripheral edge part 13 is stopped in the vicinity of the semiconductor layer 11 to assuredly prevent the adhesive material from dropping to the mounting board 70. $SiO_2$ or the like may be used as the material lower in its wettability than that of the semiconductor layer 11 and that of the sapphire substrate 12. A coating process of the roughened peripheral edge part 13 or the semiconductor layer 11 may be carried out by a known method such as an application, evaporation, a spattering or the like.

Figure 3A:
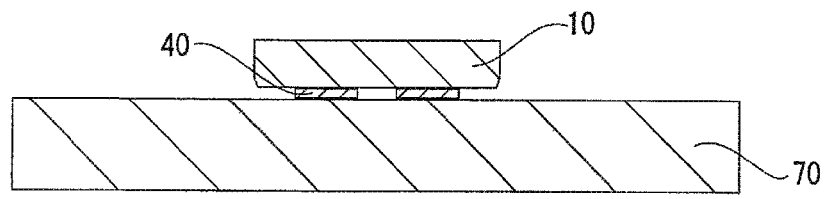
FIGS. 3A to 3E are schematic explanatory views of a method for manufacturing the light emitting device according to the first exemplary embodiment.

Now, a method for manufacturing the light emitting device 1 of the present exemplary embodiment will be described below by referring to FIGS. 3A to 3E. Initially, as shown in FIG. 3A, the flip-chip type light emitting element 10 is mounted on the wiring pattern on the upper surface of the mounting board 70 through the bumps 40.

Figure 3B:
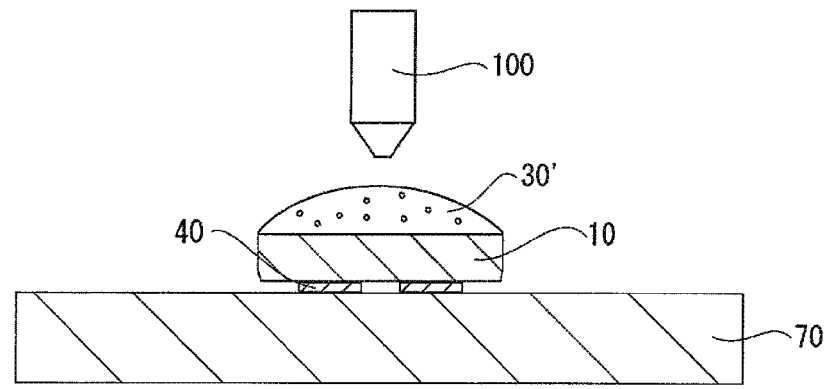

Then, as shown in FIG. 3B, only a suitable quantity of the adhesive material 30' (not solidified) is potted (dropped) on the upper surface of the light emitting element 10 by a dispenser 100 and the light transmission member 20 is mounted thereon and pressurized.

Figure 3C:
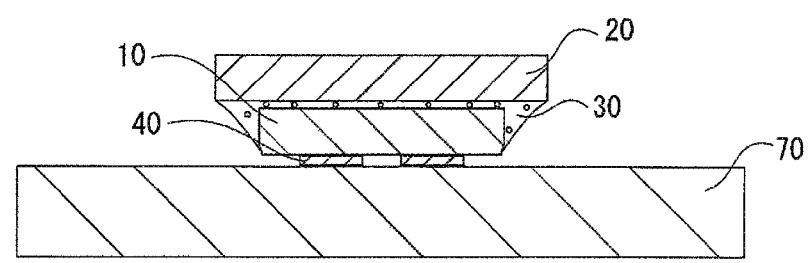

Thus, as shown in FIG. 3C, the adhesive material 30' to be solidified covers at least a part of the side surface of the light emitting element 10 and maintains the surface tension to form the inclined surface 32 which connects the side surface of the light emitting element 10 to the end part of the light transmission member 20. The adhesive material 30' is solidified by a prescribed solidification process to form the adhesive material layer 30.

Figure 3D:
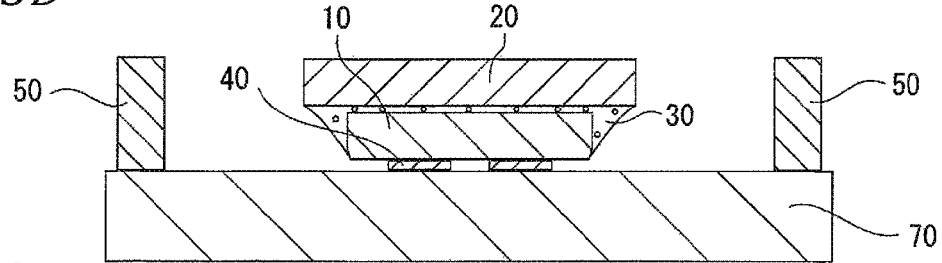

Then, as shown in FIG. 3D, the dam 50 is formed on the upper surface of the mounting board 70 with the resin.

Figure 3E:
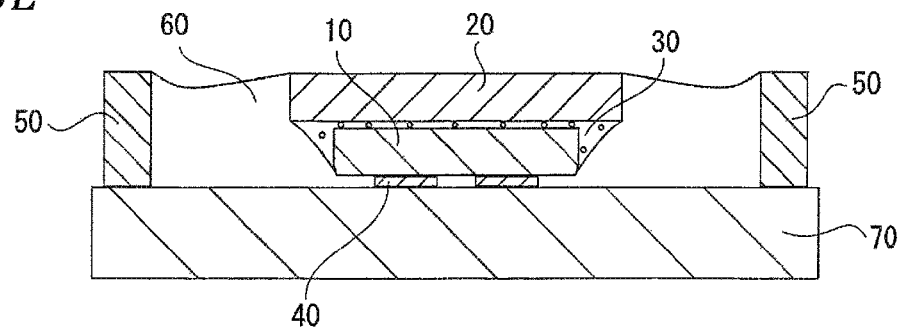

Further, as shown in FIG. 3E, the reflective material (not solidified) is injected between the light emitting element 10, the adhesive material layer 30 and the light transmission member 20 and the dam 50 by the dispenser. At this time, the reflective material is injected so that peripheries of the bumps 40 in the lower part of the light emitting element 10 may be sufficiently filled with the reflective material. Further, the reflective material is injected so that the reflective material (not solidified) may be stuck closely to the inclined surface 32 of the adhesive material layer 30 and the side surface of the light transmission member 20 without gaps. Thus, the reflective material layer 60 having an inclined surface of the configuration along the inclined surface 32 of the adhesive material layer 30 can be formed. Finally, the reflective material is solidified by a prescribed solidification process to form the reflective material layer 60. By the above-described processes, the light emitting device 1 of the present exemplary embodiment is manufactured.

The light transmission member 20 may have a structure that a roughened surface may be provided in one of the upper surface and the lower surface, or in both the surfaces to generate a light scattering. In this case, when the roughened surface is provided in the upper surface of the light transmission member 20, a size of an area where the roughened surface is provided, a roughness of the roughened surface, a configuration of irregularities forming the roughened surface and a density of the irregularities are desired to be adjusted so that the resin to be solidified does not climb up to the upper surface of the light transmission member 20 in the process that the adhesive material layer 30 or the reflective material layer 60 is formed.

Second Exemplary Embodiment

Figure 4:
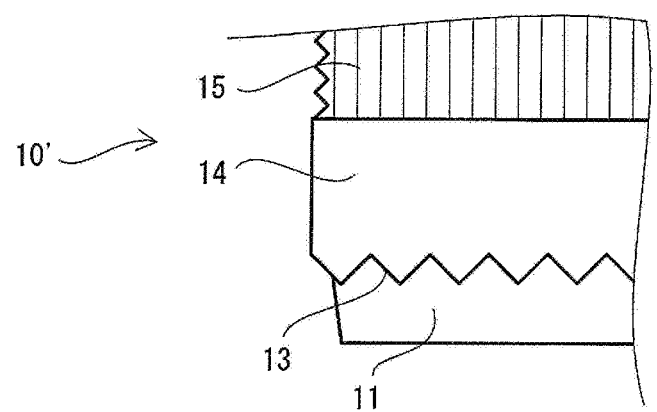
FIG. 4 is a partial front view which schematically shows only main parts of a light emitting device according to a second exemplary embodiment of the present invention.

FIG. 4 is a partial front view which schematically shows only a part of a light emitting element 10' according to a second exemplary embodiment of the present invention and corresponds to the partial front view of the light emitting element 10 according to the first exemplary embodiment shown in FIG. 2B. In the second exemplary embodiment, as shown in FIG. 4, an entire part of a surface of a sapphire substrate 12 opposed to a mounting board 70 is roughened. A peripheral edge part of a semiconductor layer 11 is removed so as to expose the roughened surface of the sapphire substrate 12, so that a roughened peripheral edge part 13 is formed. In the light emitting element 10' having such a structure, an adhesive material to be solidified can be dammed in the roughened peripheral edge part 13. To such a roughened surface, can be applied irregularities of a machined substrate that conical or truncated conical protrusions are periodically formed to allow the semiconductor layer 11 to grow with good crystallization. Since in a side surface of the light emitting element 10', a stepped part is formed between the sapphire substrate 12 and the semiconductor layer 11, the adhesive material 30' can be more assuredly stopped. Accordingly, the light emitting element 10' can be used in the same form as that of the light emitting element 10 of the first exemplary embodiment and the same effects can be obtained.

Modified Examples

Figure 5A:
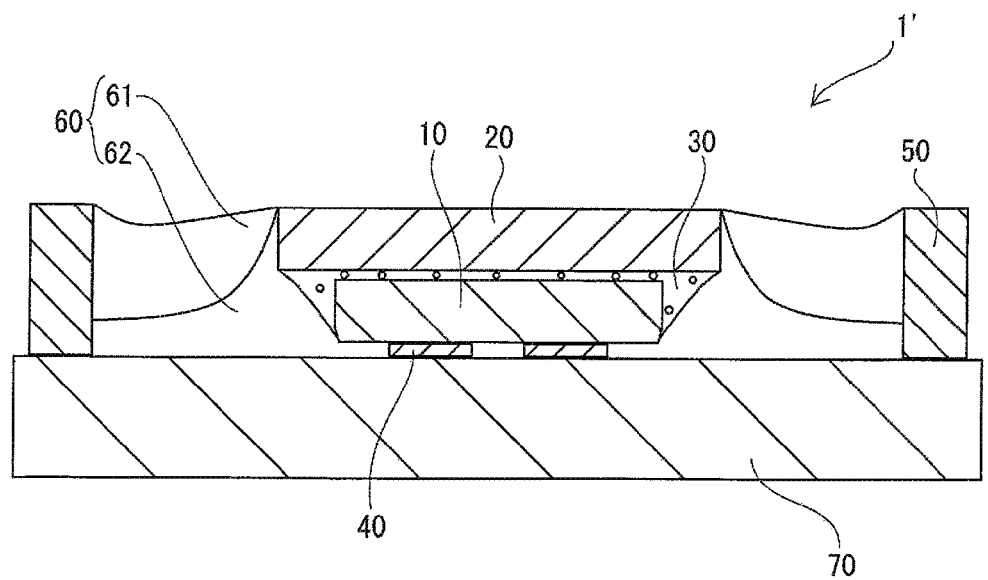
FIGS. 5A and 5B are sectional views which schematically show light emitting devices according to modified examples of the first exemplary embodiment and the second exemplary embodiment.
Figure 5B:
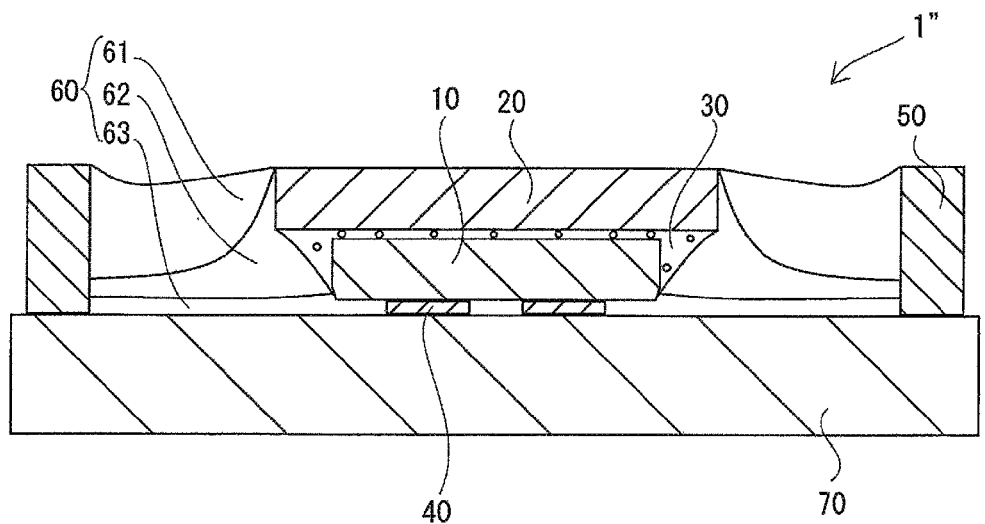

FIGS. 5A and 5B are sectional views which schematically show light emitting devices 1' and 1" according to modified examples of the first exemplary embodiment and the second exemplary embodiment. In the light emitting devices 1' and 1" of the modified examples, a reflective material layer 60 has a multilayer structure. Namely, the reflective material layer 60 of the light emitting device 1' shown in FIG. 5A has a two-layer structure having a first layer 61 of an upper layer side and a second layer 62 of a lower layer side. The second layer 62 covers a surface of a mounting board 70 and side surfaces of a light emitting element 10, an adhesive material layer 30 and a light transmission member 20. In such a structure, when a resin higher in its light reflection factor than that of the first layer 61 is used in the second layer 62, lights leaking from the side surface of the light emitting element 10 or the light transmission member 20 can be assuredly reflected. Further, in order to prevent deterioration (especially, a deterioration of an electrode) due to sulfide gas from an external part, a gas permeability of the lower layer 62 near the electrode and the mounting board 70 is preferably lowered.

In an optical system of a lighting device in which the light emitting device 1' is built, there is a fear that lights from other parts than a light emitting part (a surface of the light transmission member 20), for instance, lights reflected on the surface of the reflective material layer 60 become stray lights which give a bad influence to an illumination quality. Thus, the first layer 61 is preferably colored such as a black color low in its reflection factor and high in its light absorption coefficient. When the stray lights give no influence, the first layer 61 high in its reflection factor may be used to improve availability of the lights.

On the other hand, a reflective material layer 60 of the light emitting device 1" shown in FIG. 5B has a three-layer structure including a first layer 61 of an upper layer side, a second layer 62 as an intermediate layer and a third layer 63 of a lower layer side. The second layer 62 covers side surfaces of an adhesive material layer 30 and a light transmission member 20. The third layer 63 covers a surface of a mounting board 70 and a light emitting element 10. In such a structure, when a resin higher in its light reflection factor than that of the first layer 61 is used in the second layer 62 and the third layer 63, lights leaking from the light emitting element 10 or the side surface of the light transmission member 20 can be assuredly reflected. Further, in order to prevent a deterioration (especially, a deterioration of an electrode) due to sulfide gas from an external part, a gas permeability of the second layer 62 or the third layer 63 (especially, the third layer 63) near the electrode and the mounting board 70 is preferably lowered.

Further, the third layer 63 may have a relatively low viscosity. Thus, a reflective material to be solidified is liable to enter a gap in a lower part of the light emitting element 10, so that an occurrence of a void can be suppressed. When the second layer 62 has a higher viscosity than that of the third layer 63, a large quantity of light reflective material can be preferably dispersed in the second layer 62.

In an optical system of a lighting device in which the light emitting device 1″ is built, there is a fear that lights from other parts than a light emitting part (a surface of the light transmission member 20), for instance, lights reflected on the surface of the reflective material layer 60 become stray lights which give a bad influence to an illumination quality. Thus, the first layer 61 is preferably colored such as a black color low in its reflection factor and high in its light absorption coefficient. When the stray lights give no influence, the first layer 61 high in its reflection factor may be used to improve availability of the lights.

The present invention is not limited to the above-described aspects and the explanation of the exemplary embodiments respectively. The present invention may include various modified embodiments within a range that a person with ordinary skill can easily consider without deviating from the description of claims. Contents of the publication clearly stated in the specification are quoted by involving all the contents thereof.

What is claimed is:

1. A light emitting device, including:
   a semiconductor light emitting element comprising a sapphire substrate and a semiconductor layer;
   a mounting board; and
   a light transmission member,
   wherein the sapphire substrate is bonded to the light transmission member by an adhesive material,
   wherein the semiconductor light emitting element is mounted on the mounting board in a form of a flip-chip,
   wherein a roughened peripheral edge part is formed in the sapphire substrate in a mounting board side,
   wherein the roughened peripheral edge part is formed in such a way that a side surface of the sapphire substrate in the mounting board side is roughened, and
   wherein the sapphire substrate includes the roughened peripheral edge part, a wall opening part, and a laser beam machined surface, in order from the mounting board side.

2. The light emitting device according to claim 1, wherein a width of the roughened peripheral edge part is located within a range of 1 μm to 40 μm.

3. The light emitting device according to claim 1, wherein an irregularity of the laser beam machine surface is larger than an irregularity of the roughened peripheral edge part.

4. The light emitting device according to claim 1, wherein an angle of a surface of the roughened peripheral edge part to the side surface of the sapphire substrate is located within a range of 5° to 50°.

5. The light emitting device according to claim 1, wherein an entire part of a surface of the sapphire substrate opposed to the mounting board is roughened, and
   wherein a peripheral edge part of the semiconductor layer is removed to form the roughened peripheral edge part.

6. The light emitting device according to claim 1, wherein a surface roughness (Ra) of the roughened peripheral edge part is within a range of 0.1 μm to 20 μm.

7. A light emitting device, including:
   a semiconductor light emitting element comprising a sapphire substrate and a semiconductor layer;
   a mounting board; and
   a light transmission member,
   wherein the sapphire substrate is bonded to the light transmission member by an adhesive material,
   wherein the semiconductor light emitting element is mounted on the mounting board in a form of a flip-chip,
   wherein a roughened peripheral edge part is formed in the sapphire substrate in a mounting board side, and
   wherein the roughened peripheral edge part is coated with a material lower in its wettability than that of the sapphire substrate.

8. The light emitting device according to claim 7, wherein the material which is lower in its wettability than that of the sapphire substrate comprises $SiO_2$.

9. A method for manufacturing a light emitting device according to claim 1, the method including:
   forming a roughened peripheral edge part on the surface of a wafer as a semiconductor light emitting element;
   dividing the wafer to form the semiconductor light emitting element;
   mounting the semiconductor light emitting element on a mounting board; and
   bonding a sapphire substrate to a light transmission member by an adhesive material to cover a side surface of the semiconductor light emitting element to the roughened peripheral edge part with the adhesive material.

10. The method according to claim 9, wherein the roughened peripheral edge part is formed by removing a part of a semiconductor layer and the sapphire substrate of the wafer to expose the sapphire substrate.

11. The method according to claim 10, further including applying a laser beam to the wafer to form a laser beam machined part in the sapphire substrate, wherein the wafer is divided after forming of the laser beam machined part, so that a laser machine surface, a wall opening surface and the roughened peripheral edge part are formed on the side surface of the semiconductor light emitting element.

* * * * *